(12) United States Patent
Taniguchi et al.

(10) Patent No.: US 8,450,906 B2
(45) Date of Patent: May 28, 2013

(54) PIEZOELECTRIC THIN-FILM RESONATOR

(75) Inventors: Shinji Taniguchi, Tokyo (JP); Tokihiro Nishihara, Tokyo (JP); Masafumi Iwaki, Tokyo (JP); Masanori Ueda, Tokyo (JP); Tsuyoshi Yokoyama, Tokyo (JP); Takeshi Sakashita, Tokyo (JP); Motoaki Hara, Miyagi (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/449,072

(22) Filed: Apr. 17, 2012

(65) Prior Publication Data
US 2012/0200199 A1 Aug. 9, 2012

Related U.S. Application Data

(63) Continuation of application No. PCT/JP2010/066642, filed on Sep. 27, 2010.

(30) Foreign Application Priority Data

Oct. 22, 2009 (JP) .................................. 2009-243625

(51) Int. Cl.
*H01L 41/09* (2006.01)
*H03H 9/00* (2006.01)

(52) U.S. Cl.
USPC ............ 310/320; 310/365; 310/369; 333/187

(58) Field of Classification Search
USPC .................. 310/320, 365, 367, 369; 333/187
See application file for complete search history.

(56) References Cited

U.S. PATENT DOCUMENTS

| 4,720,651 | A  | * | 1/1988  | Nakazawa et al. | 310/369 |
| 5,589,725 | A  | * | 12/1996 | Haertling | 310/358 |
| 7,116,034 | B2 | * | 10/2006 | Wang et al. | 310/320 |
| 7,477,001 | B2 | * | 1/2009  | Sato | 310/320 |
| 8,085,115 | B2 | * | 12/2011 | Taniguchi et al. | 333/187 |
| 2004/0021529 | A1 | | 2/2004 | Bradley et al. | |
| 2006/0091764 | A1 | | 5/2006 | Tsutsumi et al. | |
| 2006/0152110 | A1 | * | 7/2006 | Taniguchi et al. | 310/322 |
| 2007/0152775 | A1 | | 7/2007 | Fujii et al. | |

(Continued)

FOREIGN PATENT DOCUMENTS

| JP | 63-305608 A | 12/1988 |
| JP | 06-40611 A | 2/1994 |

(Continued)

OTHER PUBLICATIONS

Nakamura et al., "ZnO/SiO2-Diaphragm Composite Resonator on a Silicon Wafer", Electron. Lett., Jul. 9, 1981, vol. 17, No. 14, pp. 507-509.

(Continued)

*Primary Examiner* — Thomas Dougherty
(74) *Attorney, Agent, or Firm* — Chen Yoshimura LLP

(57) ABSTRACT

A piezoelectric thin-film resonator includes a substrate, a lower electrode provided on the substrate, a piezoelectric film provided on the substrate and the lower electrode, an upper electrode provided on the piezoelectric film, and an additional pattern, a cavity being formed between the lower electrode and the substrate in a resonance portion in which the lower electrode and the upper electrode face each other through the piezoelectric film, the additional pattern being provided in a position that is on the lower electrode and includes an interface between the resonance portion and a non-resonance portion.

13 Claims, 5 Drawing Sheets

U.S. PATENT DOCUMENTS

| | | | |
|---|---|---|---|
| 2007/0222336 A1* | 9/2007 | Grannen et al. | 310/320 |
| 2007/0252476 A1 | 11/2007 | Iwaki et al. | |
| 2008/0129417 A1 | 6/2008 | Taniguchi et al. | |
| 2008/0143215 A1* | 6/2008 | Hara et al. | 310/328 |
| 2008/0284543 A1 | 11/2008 | Taniguchi et al. | |
| 2009/0200899 A1* | 8/2009 | Osaka et al. | 310/365 |
| 2009/0206706 A1* | 8/2009 | Iwaki et al. | 310/365 |
| 2012/0194297 A1* | 8/2012 | Choy et al. | 333/187 |

FOREIGN PATENT DOCUMENTS

| | | |
|---|---|---|
| JP | 2004-64785 A | 2/2004 |
| JP | 2006-128993 A | 5/2006 |
| JP | 2007-300430 A | 11/2007 |
| JP | 2008-103798 A | 5/2008 |
| JP | 2008-131194 A | 6/2008 |
| JP | 2008-288819 A | 11/2008 |
| WO | 2006/027873 A1 | 3/2006 |

OTHER PUBLICATIONS

International Search Report (ISR) issued in PCT/JP2010/066642 mailed in Dec. 2010.

\* cited by examiner

PIEZOELECTRIC THIN-FILM RESONATOR

CROSS-REFERENCE TO RELATED APPLICATION

This application is a continuation application of PCT/JP2010/066642 filed Sep. 27, 2010 claiming priority of Japanese Patent Application No. 2009-243625 filed Oct. 22, 2009, the contents of which are herein wholly incorporated by reference.

FIELD

A certain aspect of the present invention relates to piezoelectric thin-film resonators.

BACKGROUND

There is an increasing demand for compact and lightweight resonators and filters configured by the combination of these resonators due to the rapid spread of radio devices that are typically portable phones. Generally, dielectric filters and surface acoustic wave (SAW) filters have been used. Recently, attention has been being drawn to filters using piezoelectric thin-film resonators, which have low insertion loss in the RF range, high power durability and high electrostatic resistance and are miniaturized and integrated in a monolithic form.

As an exemplary type of piezoelectric thin-film resonator, there is known an FBAR (Film Bulk Acoustic Resonator) type of resonator. This type of resonator is configured to have a multilayer structure composed of a lower electrode, a piezoelectric film and an upper electrode as main structural elements, and to have a cavity below the lower electrode in an area in which the lower electrode and the upper electrode face each other through the piezoelectric film in order to make it possible for the multilayer structure to vibrate freely.

Electron. Lett., 17 (1981), pp. 507-509 (Document 1) discloses a piezoelectric thin-film resonator of a via hole type. Japanese Examined Patent Application Publication No. 6-40611 (Document 2) discloses a cavity type of piezoelectric thin-film resonator configured to form a cavity between a lower electrode and a substrate. Japanese Unexamined Patent Application Publication No. 2004-64785 (Document 3) discloses another cavity type of piezoelectric thin-film resonator configured to form a recess in a substrate. Yet another type of piezoelectric thin-film resonator is disclosed in Japanese Unexamined Patent Application Publication Nos. 2006-128993, 2007-300430 and 2008-103798 (Documents 4, 5 and 6, respectively) in which at least a portion of the outer circumference of a piezoelectric thin film through which upper and lower electrode face each other is further in than the outer circumference of an area in which the upper and lower electrodes face each other.

The piezoelectric thin-film resonators disclosed in Documents 1 through 3 are configured to have a dielectric thin-film formed on a face that adjoins air below the lower electrode. Since the resonance frequency of the piezoelectric thin-film resonator is influenced directly by variation in thickness, many management items are needed to reduce a thickness dispersion at the time of film growth.

In Documents 4 through 6, the cross section of an end surface of the piezoelectric film after processing the piezoelectric film by etching has a slant shape, which degrades the resonance characteristic.

SUMMARY

According to an aspect of the present invention, there is provided a piezoelectric thin-film resonator including: a substrate; a lower electrode provided on the substrate; a piezoelectric film provided on the substrate and the lower electrode; an upper electrode provided on the piezoelectric film; and an additional pattern, a cavity being formed between the lower electrode and the substrate in a resonance portion in which the lower electrode and the upper electrode face each other through the piezoelectric film, the additional pattern being provided in a position that is on the lower electrode and includes an interface between the resonance portion and a non-resonance portion.

DETAILED DESCRIPTION

Figure 1A:
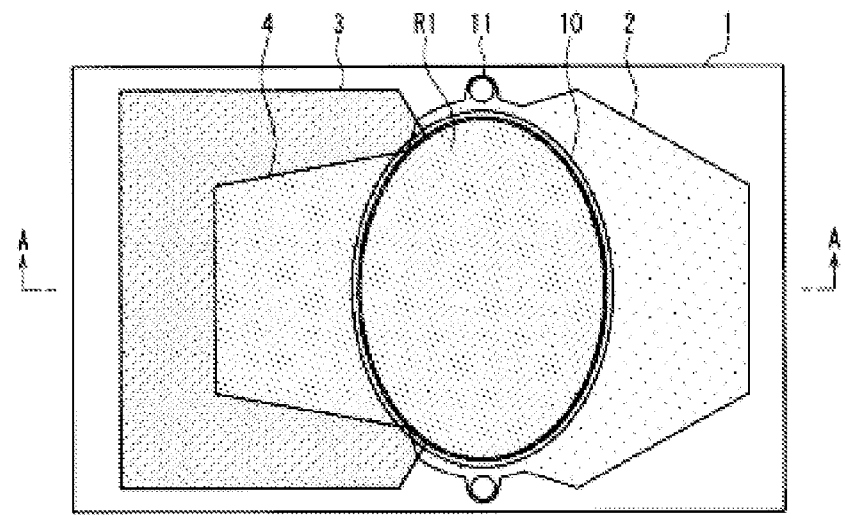
FIG. 1A is a plan view of a piezoelectric thin-film resonator in accordance with an embodiment.

As one of the piezoelectric thin-film resonators, a resonator of FBAR type is known. This resonator is configured to have a multilayer structure having a lower electrode, a piezoelectric film and an upper electrode as main structural elements, and to have a cavity below the lower electrode in an area in which the lower electrode and the upper electrode face each other through the piezoelectric film in order to make it possible for the multilayer structure to vibrate freely.

When an RF electric signal is applied between the upper electrode and the lower electrode, an acoustic wave is excited within the piezoelectric film sandwiched between the upper and lower electrodes due to the inverse piezoelectric effect. Also, a deformation caused by the acoustic wave is converted into an electric signal due to the piezoelectric effect. Since the acoustic wave is totally reflected by an interface between the upper electrode film and air and an interface between the lower electrode film and air, the acoustic wave is a thickness extensional vibration wave having main displacements in the thickness direction of the piezoelectric thin-film. In this structure, resonance takes place at frequencies (H=nλ/2) at which the total film thickness H of the multilayer structure having the main structural element of the upper electrode film/piezoelectric film/lower electrode film formed above the cavity is integer multiples (n times) of ½ of the wavelength λ of the acoustic wave. Assuming that V is the propagation velocity of the acoustic wave defined by the material of the piezoelectric film, the resonance frequency F is expressed as $$F=nV/(2H).$$

By controlling the resonance frequency by the film thickness, it is possible to produce resonators having desired frequency characteristics, or filters composed of multiple resonators. The filters may be applied to duplexers or other communication devices.

The cavity may be formed by etching (wet etching or dry etching) from the back surface of a silicon substrate used as a device substrate, or wet etching of a sacrificed layer provided on the silicon substrate. Hereinafter, a hole that penetrates through the substrate from the back surface to the front surface is referred to as "via hole", and a cavity that exists in the vicinity of the surface of the substrate and just below the lower electrode is referred to as "cavity". The piezoelectric thin-film resonator of FBAR type is classified into a via hole type and a cavity type.

The piezoelectric thin-film resonator disclosed in Document 1 is configured to form, on a (100) silicon substrate having a thermal oxide film (SiO2), a lower electrode of Au—Cu, a piezoelectric substrate of ZnO, and an upper electrode of Al. A via hole may be formed by anisotropic etching using a KOH solution or an EDP solution (ethylenediamine+pyrocatechol+water) from the backside of the silicon substrate.

The cavity type of piezoelectric thin-film resonator has cavity formed by forming an upper electrode/piezoelectric film/lower electrode structure on a sacrificed layer, and finally removing the sacrificed layer by etching. Document 2 discloses a piezoelectric thin-film resonator having a cavity between the lower electrode and the substrate. The piezoelectric thin-film resonator disclosed in Document 2 has a cavity (air bridge structure) formed by forming a sacrificed pattern of ZnO having an island shape, forming a dielectric film/upper electrode/piezoelectric film/lower electrode/dielectric film structure, and removing the sacrificed layer by an acid.

Document 3 discloses a piezoelectric thin-film resonator in which a recess portion is formed below an area in which an overlapping upper electrode/piezoelectric film/lower electrode/protection film structure is formed. A cavity of the piezoelectric thin-film resonator disclosed in Document 3 may be formed by depositing a sacrificed layer in the recess portion formed beforehand and flatting the substrate surface, and then by forming the upper electrode/piezoelectric film/lower electrode/protection film structure and finally removing the sacrificed layer by etching.

The piezoelectric thin-film resonators respectively disclosed in Documents 1, 2 and 3 have a dielectric thin-film on a face that adjoins air below the lower electrode. The thickness of each of all the films that form the resonance or membrane portion of the piezoelectric thin-film resonator directly influences the resonance frequency of the piezoelectric thin-film resonator. Therefore, the process of forming many piezoelectric thin-film resonators on one substrate is required to control the dispersion of the thickness of each of all the films that form the resonance portion so as not to have a dispersion of the resonance frequency. The thickness of the dielectric thin-film below the lower electrode is not an exception. Many management items are required to reduce the dispersion of the thickness of each film.

The piezoelectric thin-film resonators are further required to have a reduced insertion loss in order to improve the characteristics of the filter with the resonators. A factor of increase in the insertion loss is a phenomenon in which the acoustic wave laterally leaks to the outside of the resonance area in which the upper and lower electrodes face each other through the piezoelectric film, that is, to an area in which the acoustic wave cannot be converted into the electric signal. Documents 4, 5 and 6 discloses piezoelectric thin-film resonators in which at least a part of the outer circumference of the piezoelectric thin-film resonator is located further in than the outer circumference of the area in which the upper and lower electrodes face each other. This piezoelectric film is formed by overetching in many cases.

Further, the piezoelectric thin-film resonators disclosed in Documents 4, 5 and 6 have a cross section of the piezoelectric film having a slant shape and have a difficulty in forming a vertical cross section desirable to improve the resonance characteristics.

Further, the piezoelectric thin-film resonators disclosed in Documents, 4, 5 and 6 are configured to hold the resonance portion only by the lower electrode and have an insufficient mechanical strength. Further, since the piezoelectric film is exposed in the end portion of the lower electrode, the piezoelectric film may be etched by the etchant used in removal of the sacrificed layer and a problem in humidity resistance of the finished devices.

Piezoelectric thin-film resonators of embodiments have improvements in the mechanical strength of the lower electrode and those in the humidity resistance in the end portion of the lower electrode while having a reduced number of layers to be thickness-controlled, and have improvements in the resonance characteristic by controlling the shape of the piezoelectric film defined by etching.

Embodiment 1

Figure 1B:
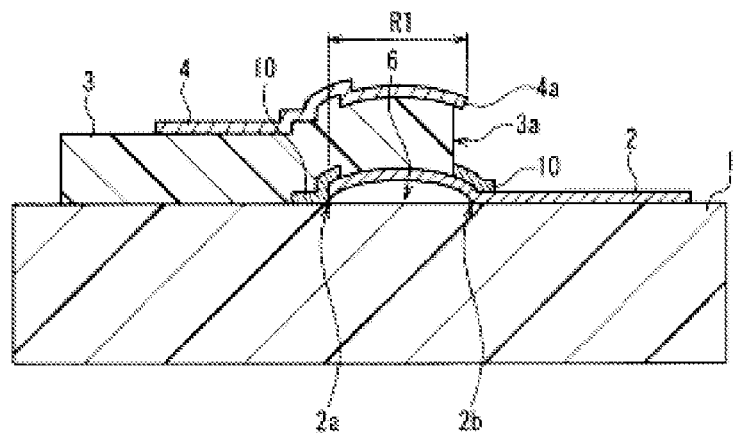
FIG. 1B is a cross-sectional view taken along a line A-A in FIG. 1A.

FIG. 1A is a plan view of a piezoelectric thin-film resonator in accordance with the present embodiment. FIG. 1B is a cross-sectional view taken along a line A-A in FIG. 1A. The piezoelectric thin-film resonator includes a substrate 1, a lower electrode 2, a piezoelectric film 3, an upper electrode 4 and an additional pattern 10.

The substrate 1 is a silicon substrate having a flat main surface in the present embodiment. Instead of the silicon substrate, the substrate 1 may be a silica substrate, a glass substrate, a ceramic substrate, a GaAs substrate or the like. The substrate 1 may be one having a difficulty in forming via holes.

The lower electrode 2 and the upper electrode 4 may be ruthenium (Ru) films having a thickness of 260 nm, for example. The lower electrode 2 and the upper electrode 4 may be formed of aluminum (Al), copper (Cu), molybdenum (Mo), tungsten (W), tantalum (Ta), platinum (Pt), ruthenium (Ru), rhodium (Rh), iridium (Ir), chromium (Cr) or titanium (Ti) or a combination thereof.

The piezoelectric film 3 may be an aluminum nitride film (AlN film) having a thickness of 1200 nm. The piezoelectric film 3 may be made of aluminum nitride (AlN), zinc oxide (ZnO), lead zirconate titanate (PZT), lead titanate (PbTiO$_3$) or the like. Practically, AlN is frequently used in terms of the sonic velocity, temperature characteristic and Q value as well as the easiness and proficiency level of the film growth technique. Particularly, one of the important factors that define the resonance characteristic is to form the AlN film having a high crystalline oriented in the c axis (the vertical direction with respect to the surface of the lower electrode), and directly influences the coupling coefficient and the Q value. However, high energy should be applied to form the AlN film having a high crystalline oriented in the c axis. For example, the substrate should be heated at 1000° C. or higher in MOCVD (Metal Organic Chemical Vapor Deposition), and should be heated at 400° C. or higher with power of plasma in PECVD (Plasma Enhanced Chemical Vapor Deposition). Even using the sputtering technique, it is known that the temperature of the substrate rises by sputtering of an insulative film. Thus, generally, the AlN film has strong film stress.

A cavity 6 having a dome-shaped bulge is formed between the lower side of the lower electrode 2 and the flat main surface of the substrate 1 in the area (resonance portion R1) in which the upper electrode 4 and the lower electrode 2 face each other through the piezoelectric film 3. In the present embodiment, as illustrated in FIG. 1A, the resonance portion R1 has an elliptical planar shape. The planar shape of the cavity 6 includes the resonance portion 1 (an elliptical shape) and is larger than the resonance portion R1. The cavity 6 may be formed by removing the sacrificed layer that has been patterned under the lower electrode. Thus, there are locally provided openings 11 for introducing an etchant used for etching the sacrificed layer to form the cavity 6 below the lower electrode 2. The openings 11 may be formed before the sacrificed layer is etched or may be formed concurrently when the lower electrode 2 is etched.

The additional pattern 10 is provided so as to include at least the resonance portion R1 in the periphery of the lower electrode 2. That is, as illustrated in FIG. 1B, the additional pattern 10 has a portion that is outwardly extended up to the upper surface of the substrate 1 beyond an end portion 2a of the lower electrode 2. The additional pattern 10 has another portion that is other than the portion extending beyond the end portion 2a of the lower electrode 2 and is extended from a portion of the lower electrode 2 above the cavity 6 to another portion of the lower electrode 2 attached to the substrate 1. The additional pattern 10 is provided so as to extend over a hold portion 2b of the lower electrode 2, which is a boundary portion between a portion of the lower electrode 2 adjoining the cavity 6 and another portion thereof contacting the substrate 1.

Thus, the hold portion 2b of the lower electrode 2 has an increased physical thickness, so that the mechanical strength can be improved. In contrast, a piezoelectric thin-film resonator that does not have the additional pattern 10 and holds the resonance portion R1 only by the lower electrode 2 may have an insufficient mechanical strength because the resonance portion R1 is held only by the lower electrode 2 in the hold portion 2b thereof.

FIGS. 2A through 2E are respectively cross-sectional views that illustrate steps of a method for manufacturing the piezoelectric thin-film resonator illustrated in FIGS. 1A and 1B. FIG. 3A is a plan view of a sacrificed layer 9. FIGS. 3B and 3C are respectively plan views of the lower electrode 2 and the sacrificed layer 9.

The method for manufacturing the piezoelectric thin-film resonator of the present embodiment described below includes a step of forming the sacrificed layer 9 (MgO) on the silicon substrate 1. The sacrificed layer 9 is patterned into an elliptical shape, as illustrated in FIG. 3A.

Figure 2A:
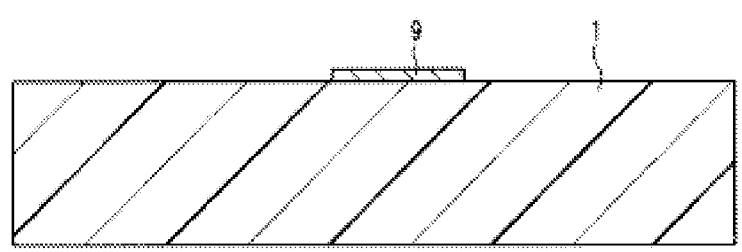
FIG. 2A is a cross-sectional view illustrating a step of manufacturing the piezoelectric thin-film resonator in accordance with the embodiment.
Figure 2B:
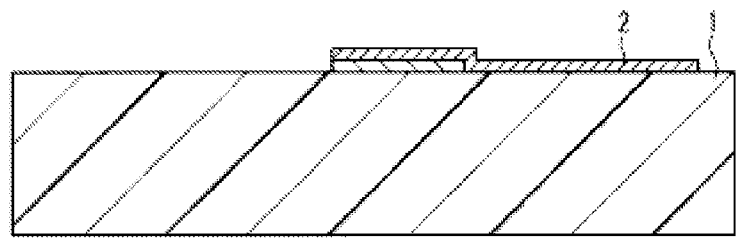
FIG. 2B is a cross-sectional view illustrating a step of manufacturing the piezoelectric thin-film resonator in accordance with the embodiment.
Figure 3A:
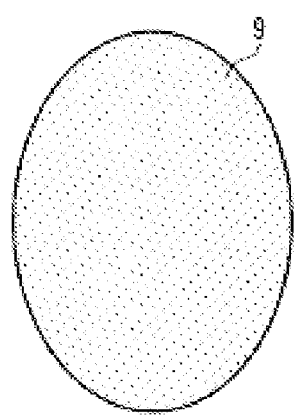
FIG. 3A is a plan view of a sacrificed layer.
Figure 3B:
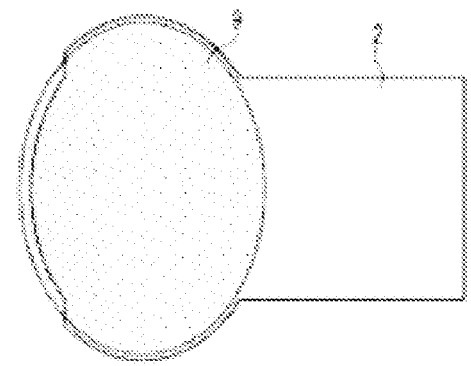
FIG. 3B is a plan view of a sacrificed layer and a lower electrode.
Figure 3C:
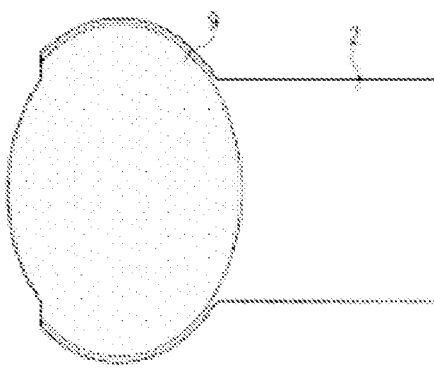
FIG. 3C is a plan view of a sacrificed layer and a lower electrode.

Next, a film for the lower electrode 2 (Ru) is grown on the silicon substrate 1 and the sacrificed layer 9, and is patterned into the shape illustrated in FIG. 2B by the photolithography technique and the etching process. The lower electrode 2 is formed in the shape illustrated in FIG. 3B when it is grown on the sacrificed layer 9 and is formed in the shape illustrated in FIG. 3C by patterning. In FIGS. 2B and 3C, the shape of the end portion 2a of the lower electrode 2 and the shape of the sacrificed layer 9 approximately coincide with each other.

Figure 2C:
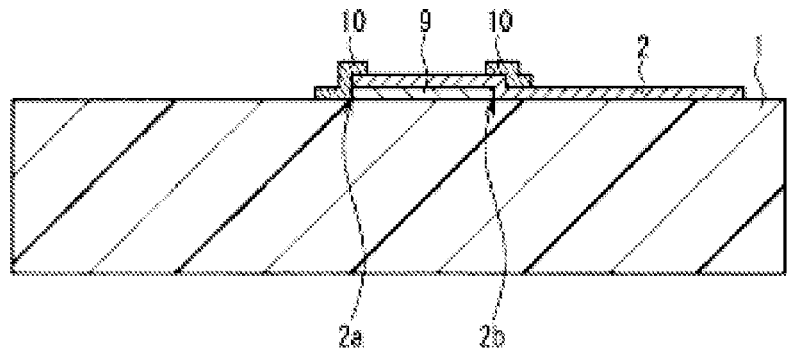
FIG. 2C is a cross-sectional view illustrating a step of manufacturing the piezoelectric thin-film resonator in accordance with the embodiment.

Then, as illustrated in FIG. 2C, the additional pattern 10 is formed so as to extend over the end portion 2a and the hold portion 2b of the lower electrode 2. A film for the additional pattern 10 is grown by a film growing technique, which may be typically sputtering, and is patterned into a desired shape by the photolithography technique and the etching process.

Figure 2D:
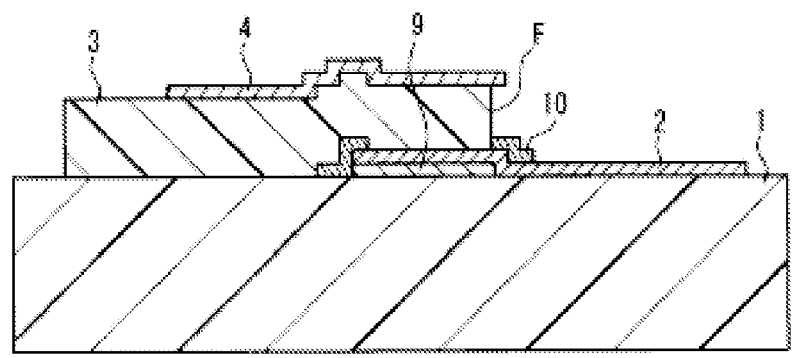
FIG. 2D is a cross-sectional view illustrating a step of manufacturing the piezoelectric thin-film resonator in accordance with the embodiment.

After that, as illustrated in FIG. 2D, the piezoelectric film 3 (AlN) is grown on the substrate 1, the lower electrode 2 and the additional pattern 10, and the upper electrode 2 is formed on the piezoelectric film 3. The piezoelectric film 3 and the upper electrode 4 may be patterned into desired shapes by the photolithography technique and the etching process.

Figure 2E:
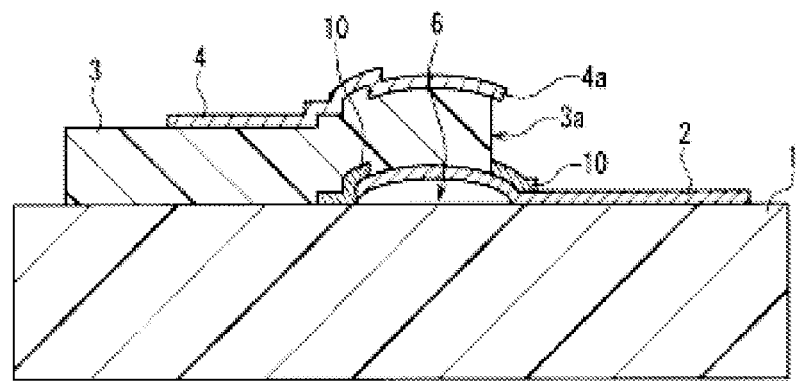
FIG. 2E is a cross-sectional view illustrating a step of manufacturing the piezoelectric thin-film resonator in accordance with the embodiment.

Then, as illustrated in FIG. 2E, the sacrificed layer 9 is removed to form the cavity 6. Specifically, the etchant is introduced into the openings 11 illustrated in FIG. 1A and flows up to the sacrificed layer 9, which is thus removed by etching. After the sacrificed layer 9 is removed, the cavity 6 is formed into a dome shape due to compressive stress in the multilayered film composed of the lower electrode 2, the piezoelectric film 3 and the upper electrode 4. The dome shape may be defined so that the height of the lower electrode 2 with respect to the substrate 1 is the largest in the center of the planar shape of the cavity 6 and is gradually decreasing towards the edge of the planar shape of the cavity 6 from the center thereof.

After the sacrificed layer 9 is removed, the planer shape of the cavity 6 in the end portion 2a of the lower electrode 2 approximately coincides with the planar shape of the end portion 2a of the lower electrode 2. In contrast, in the portion of the lower electrode 2 other than the end portion 2a, the cavity 6 below the lower electrode 2 is formed so as to be larger than the resonance portion R1. Thus, the margin of displacement of the upper electrode 4 with respect to the resonance portion R1 is increased, and the productivity is improved.

A film of MgO for the sacrificed layer 9 is grown (to a thickness of approximately 20~100 nm) by sputtering or vacuum deposition. The material of the sacrificed layer 9 is not limited to MgO but may be a material of ZnO, Ge, Ti, $SiO_2$ or the like that can be easily dissolved by an etchant.

The lower electrode 2, the piezoelectric film 3 and the upper electrode 4 may be grown by the film growing technique, which may be typically sputtering, and are then patterned into desired shapes by the photolithography technique and etching. In the steps of growing the lower electrode 2, the piezoelectric film 3 and the upper electrode 4, the pressure of sputtering gas is adjusted by the general method so that the multilayered film composed of the lower electrode 2, the piezoelectric film 3 and the upper electrode 4 has compressive stress as large as approximately −300 MP. Thus, at the time of the completion of etching the sacrificed layer 9, the multilayered film expands, and the cavity 6 having a dome-shaped bulge is formed between the lower electrode 2 and the flat main surface of the substrate 1.

A film for the additional pattern 10 is formed by the film growing technique, which may be typically sputtering, and is patterned into a desired shape by the photolithography technique and etching. Besides, the additional pattern 10 may be formed by forming a photoresist pattern having an opening in an area in which the additional pattern 10 is to be formed, growing a film for the additional pattern 10 and removing the photoresist by the liftoff technique.

The film of the additional pattern 10 may be configured to have a dielectric film, which may be typically $SiO_2$, and a film formed on the dielectric film and made of Ti, Al, Cu or the like. The materials that form the additional pattern 10 may be dissolved by an etchant that includes the main component of $H_2SO_4$ used in etching of AlN. Thus, the approximately vertical cross section of the AlN pattern may be defined by etching.

In the step of etching the piezoelectric film 3, it is desirable that an end surface 3a of the piezoelectric film 3 has a positional relationship with an end portion 4a of the upper electrode 4 in which the end surface 3a of the piezoelectric film 3 is further in than the end portion 4a of the upper electrode 4, as illustrated in FIGS. 1B and 2E. This relationship improves the resonance characteristic. It is desirable that the wet etching technique with an etchant having a main component of $H_2SO_4$ is used to form the piezoelectric film 3 and the upper electrode 4 into the respective shapes illustrated in FIGS. 1B and 2E. This is because dry etching has a difficulty in shaping of the piezoelectric film 3. Generally, the shapes illustrated in FIGS. 1B and 2E may be realized by overetching the piezoelectric film 3. However, the cross section of the piezoelectric film 3 formed by the wet etching technique has a slant shape at the time of completion of etching because the piezoelectric film 3 is isotropically etched from the upper side of the piezoelectric film 3 in general. In contrast, according to the present invention, the piezoelectric film 3 is isotropically etched at the initial stage of the etching. However, when the additional pattern 10 becomes exposed to the etchant, etching proceeds even in the surface of the additional pattern 10 that is dissolved by the etchant having a main component of $H_2SO_4$. Thus, etching from the side of the interface between the piezoelectric film 3 and the additional pattern 10 is accelerated, and the cross section of the piezoelectric film 3 is thus formed into an approximately vertical shape.

In the end portion 2a of the lower electrode 2, the etchant may contact the piezoelectric film 3 when the sacrificed layer 9 is etched. Thus, unwanted etching proceeds in the piezoelectric film 3, which may have a degraded quality. Further, even after the device is completed, the piezoelectric film 3 is exposed directly to the air and moisture outside of the device, and may have a degraded quality. According to the present embodiment, the end portion 2a of the lower electrode 2 is protected by the dielectric film (additional pattern10), which may be typically made of $SiO_2$. It is thus possible to prevent the piezoelectric film 3 from contacting the etchant and the air and moisture outside of the device in the process of forming the device or after the completion of the device and to protect the device. This makes it possible to prevent the quality of the piezoelectric film 3 from being degraded.

In the present embodiment, the materials of the substrate 1, the electrode films of the lower electrode 2 and the upper electrode 4, the piezoelectric film 3 and the additional pattern 10 are not limited to those described above, but other materials may be used.

The above-described film structures are exemplary structural elements of the piezoelectric thin-film resonator. For example, the lower electrode 2 and/or the upper electrode 4 may be a two-layer structure or a multilayer structure composed of at least three layers. A dielectric film may be provided on the upper electrode 4. The dielectric film on the upper electrode 4 may function as a protection film or a frequency adjustment film. The frequency adjustment film adds a mass or load to the top of the upper electrode 4 to vary the mechanical vibration of the resonance portion R1 in which the lower electrode 2 and the upper electrode 4 face each other through the piezoelectric film 3.

In the present embodiment, the resonance portion R1 in which the lower electrode 2 and the upper electrode 4 face each other through the piezoelectric film 3 has an elliptical shape. Besides, similar effects are obtained by a polygonal shape that does not have any parallel sides. Such a polygonal shape may be a pentagon or heptagon.

In the above-described embodiment, the piezoelectric thin-film resonator has the cavity 6 formed above the flat main surface of the substrate 1. Besides, similar effects are obtained by a piezoelectric thin-film resonator having a cavity in an area in the substrate 1 that overlaps the resonance portion R1. The cavity in the substrate 1 may be formed by dry etching for the substrate 1 from its backside after the multilayer structure that is composed of the lower electrode 2, the piezoelectric film 3 and the upper electrode 4 is formed.

Embodiment 2

Improvements in the resonance characteristic of the piezoelectric thin-film resonator of the present embodiment are analyzed.

Figure 4A:
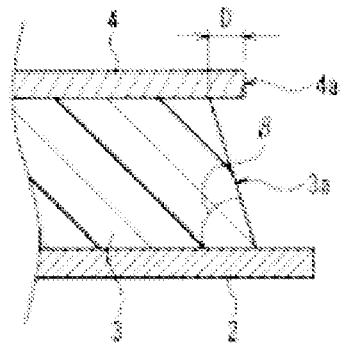
FIG. 4A is a schematic view of a piezoelectric thin-film resonator used for analyzing a resonance characteristic.
Figure 4B:
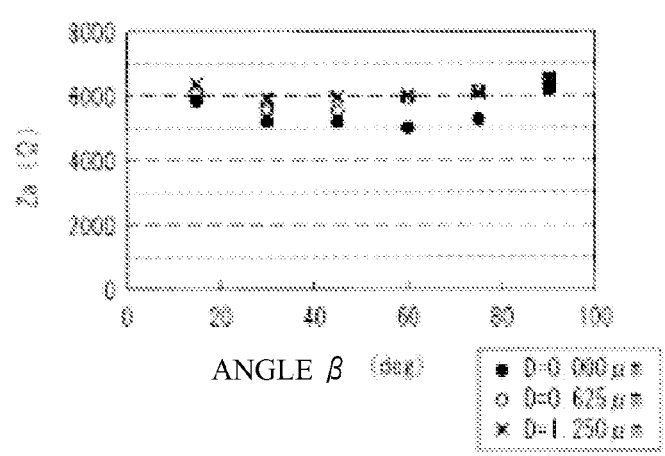
FIG. 4B is a characteristic diagram illustrating a relationship between an angle of an end surface of a piezoelectric and impedance associated with the amount of overetching of the piezoelectric film.

FIG. 4A is a partial cross-sectional view of a piezoelectric thin-film resonator used for analyzing the resonance characteristic. FIG. 4B illustrates results of an analysis of the resonance characteristic of the piezoelectric thin-film resonator using the finite element method, and shows a relationship between an angle β of a slope formed by etching the piezoelectric film 3 and an impedance Za at the anti-resonance frequency. That is, FIG. 4B shows results of calculation for cases where the angle β of the end surface 3a of the piezoelectric film 3 with respect to the surface of the lower electrode 2 in FIG. 4A and an overetching amount D of the piezoelectric film 3 with respect to the end portion 4a of the upper electrode 4 are varied. In the present embodiment, the impedance Za is analyzed in cases where the overetching amount D of the piezoelectric film 3 is set to 0 μm, 0.625 μm and 1.25 μm, and the angle β is set to 15°, 30°, 45°, 60°, 75° and 90°. A larger value of the impedance Za of the resonator indicates a better anti-resonance Q. Therefore, a filter formed by piezoelectric thin-film resonators having a large value of the impedance Za has a low insertion loss.

The angle β is not limited to the range of 15° to 90° but may be larger than 90° (that is, the end surface 3a of the piezoelectric film 3 is inversely tapered). Even in such a case, the impedance Za approximately equal to that obtained for 90° of the angle β may be obtained.

In the piezoelectric thin-film resonator used in the analysis, both the upper electrode 4 and the lower electrode 2 are made of Ru, and the piezoelectric film 3 is made of AlN. According to the calculation results illustrated in FIG. 4B, the impedance Za has a larger value as the angle β is closer to 90°, and has a small dispersion for variations of the overetching amount D. When the angle β of the end surface 3a of the piezoelectric film 3 becomes close to 90°, the impedance Za is improved without overetching amount of the piezoelectric film 3, and an unstable factor of the manufacturing process using overetching that has a difficulty in reproducibility is thus removed.

A case is supposed where, at the interface between the upper electrode 4 having the overhanging portion and the piezoelectric film 3 having the end surface 3a of the piezoelectric film 3 formed by overetching, there is a difficulty in forming a dielectric film (not illustrated) that is made of $SiO_2$ or the like that functions to protect the upper side of the piezoelectric thin-film resonator and to adjust the frequency thereof, and the dielectric film may not substantially functions as the protection film. This problem may be solved by making the end surface 3a of the piezoelectric film 3 approximately vertical to the lower electrode 2, whereby there is no need to form the overhanging portion of the upper electrode 4 and an effective protection film may be formed at the interface between the upper electrode 4 and the piezoelectric film 3. Thus, the humidity resistance may be improved.

Figure 5:
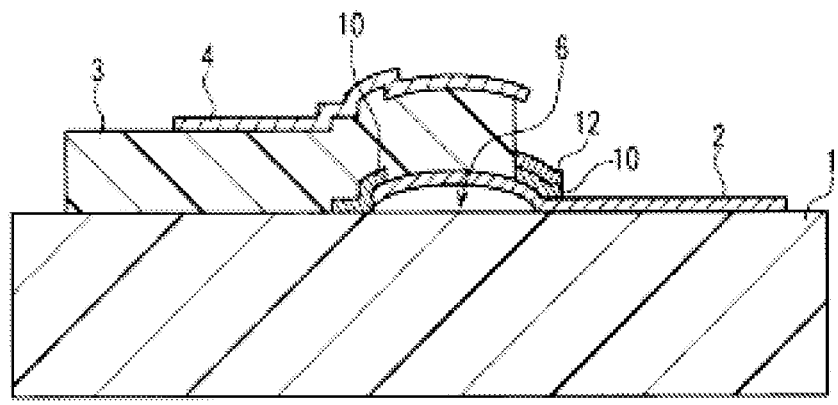
FIG. 5 is a cross-sectional view of a first variation of the piezoelectric thin-film resonator.

FIG. 5 illustrates a first variation of the piezoelectric thin-film resonator of the embodiment. A piezoelectric thin-film resonator illustrated in FIG. 5 has another additional pattern 12 on the additional pattern 10 on the hold portion 2b side of the lower electrode 2. This structure makes it possible to further increase the film thickness in the vicinity of the hold portion 2b of the lower electrode 2 and to further improve mechanical strength. The additional pattern 10 on the end portion 2a side of the lower electrode 2 may be varied to have a two-layer structure like the layer structure on the hold portion 2b side. However, satisfactory improvement in the humidity resistance of the piezoelectric film 3 may be achieved by at least one layer.

Figure 6:
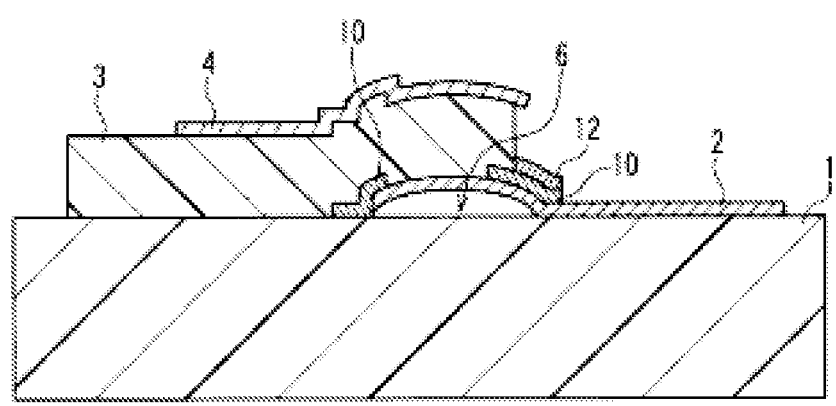
FIG. 6 is a cross-sectional view of a second variation of the piezoelectric thin-film resonator.

FIG. 6 illustrates a second variation of the piezoelectric thin-film resonator of the embodiment. A piezoelectric thin-film resonator illustrated in FIG. 6 is configured to vary the additional pattern 10 used in the piezoelectric thin-film resonator illustrated in FIG. 5 so as to extend between the piezoelectric film 3 and the lower electrode 2. With this structure, it is possible to increase the film thickness in the vicinity of the hold portion 2b of the lower electrode 2 and to further improve the mechanical strength.

Figure 7:
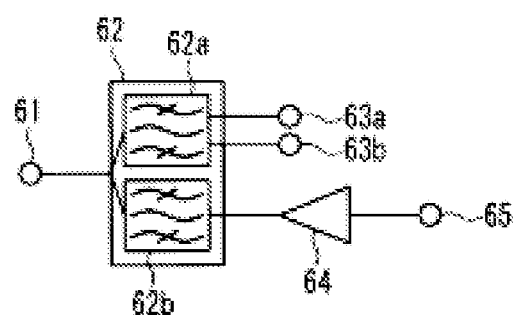
FIG. 7 is a block diagram of a communication module.

FIG. 7 is a block diagram of an exemplary communication module equipped with piezoelectric thin-film resonators of the embodiment. Referring to FIG. 7, a duplexer 62 is composed of a receive filter 62a and a transmit filter 62b. Receive terminals 63a and 63b of balanced output are connected to the receive filter 62a. The transmit filter 62b is coupled with a transmit terminal 65 via a power amplifier 64. At least one of the receive filter 62a and the transmit filter 62b is equipped with the piezoelectric thin-film resonators of the present embodiment.

In receive operation, the receive filter 62a passes only signals in a predetermined frequency band included in signals received via an antenna terminal 61. The filtered signals are output to the outside of the duplexer via the receive terminals 63a and 63b. In transmit operation, the transmit filter 62b passes only signals in a predetermined frequency band included in signals input via the transmit terminal 65 and amplified by the power amplifier 64. The filtered signals are then transmitted via the antenna terminal 61.

The communication module equipped with the piezoelectric thin-film resonators of the present embodiment achieves improvements in the mechanical strength of the lower electrode and that in the humidity resistance in the end portion of the lower electrode, and achieves improvements in the resonance characteristic by controlling the cross-sectional shape of the piezoelectric film defined by etching.

The communication module illustrated in FIG. 7 is an exemplary communication module, and similar effects may be obtained in another communication module equipped with the piezoelectric thin-film resonators of the present embodiment.

Figure 8:
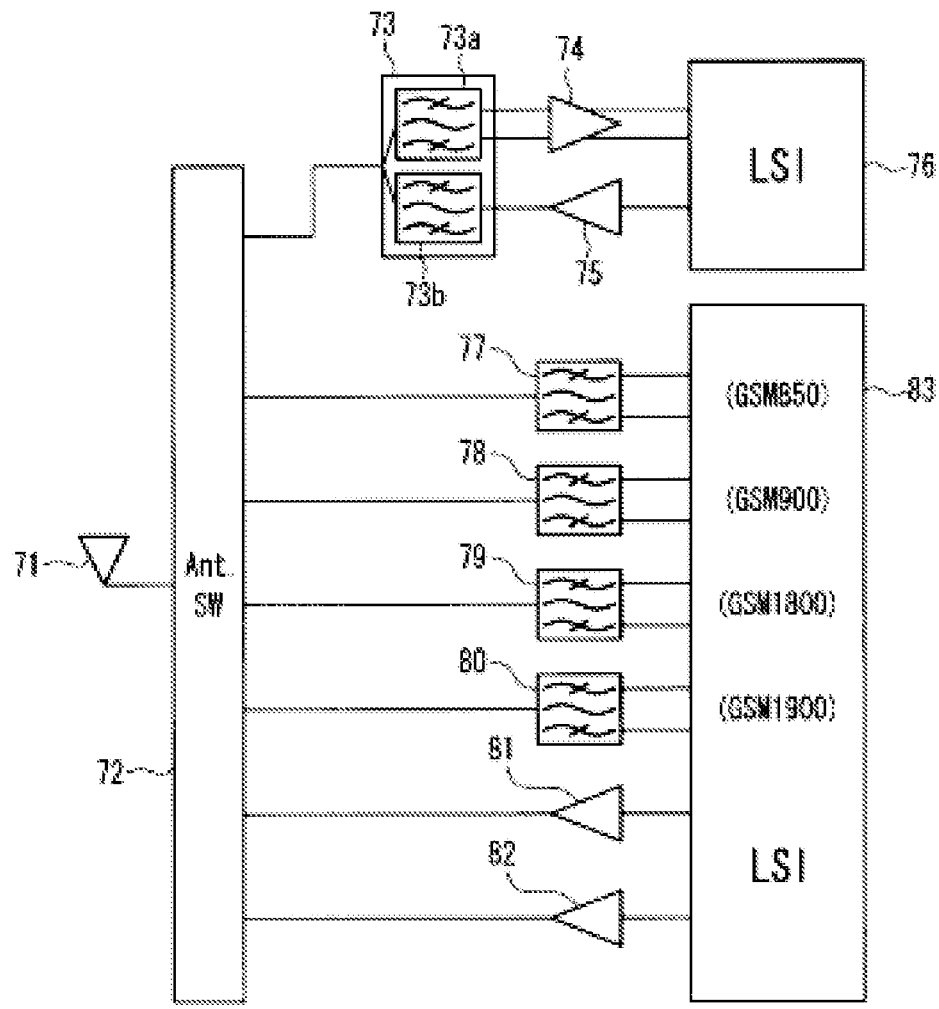
FIG. 8 is a block diagram of a communication device.

FIG. 8 illustrates an RF block of a communication device equipped with the piezoelectric thin-film resonators of the present embodiment or the above-described communication module. The communication device illustrated in FIG. 8 has a structure of a portable telephone terminal that conforms to GSM (Global System for a Mobile Communications) system and a W-CDMA (Wideband Code Division Multiple Access) system. The GSM system of the present embodiment covers the 850 MHz band, 950 MHz band, 1.8 GHz band and 1.9 GHz band. The portable telephone terminal includes a microphone, a speaker and a liquid crystal display in addition to the structural elements illustrated in FIG. 8. However, these structural elements are not described in the following description of the embodiment, and is therefore not illustrated in FIG. 8. A receive filter 73a, transmit filters 73b and 77 through 80 have the piezoelectric thin-film resonators of the embodiment.

A receive signal input via an antenna 71 is applied to an appropriate one of LSIs by an antenna switch circuit 72, which determines whether the received signal conforms to the W-CDMA system or the GSM system. When the received signal conforms to the W-CDMA system, the antenna switch circuit 72 selects the duplexer 73. The received signal input to the duplexer 73 is limited to the predetermined frequency band by the receive filter 73a, and is output to a low noise amplifier (LNA) 74 as balanced outputs. The LNA 74 amplifies the balanced received signals, and outputs these signals to an LSI 76. The LSI 76 carries out a demodulation process for reproducing the original speed signal from the received signals and controls the parts of the portable telephone terminal.

In transmit operation, the LSI 76 generates a transmit signal. The transmit signal thus generated is amplified by a power amplifier 75 and is input to the transmit filter 73b. The transmit filter 73b passes only signals in the predetermined frequency band included in the received transmit signals. The transmit signal from the transmit filter 73b is transmitted via the antenna 71 through the antenna switch circuit 72.

When the signal received via the antenna 71 conforms to the GSM system, the antenna switch circuit 72 selects one of receive filters 77 through 80 in accordance with the frequency range of the received signal, and outputs the received signal to the selected receive filter. The received signal that is limited to the frequency band defined by the selected one of the receive filters 77 through 80 is input to an LSI 83. The LSI 83 carries out a demodulation process for reproducing the original speed signal from the received signals and controls the parts of the portable telephone terminal. In transmit operation, the LSI 83 generates a transmit signal, which is then amplified by a power amplifier 81 or 82, and is transmitted via the antenna 71 through the antenna switch circuit 72.

The communication device equipped with the piezoelectric thin-film resonators of the present embodiment achieves improvements in the mechanical strength of the lower electrode and that in the humidity resistance in the end portion of the lower electrode, and achieves improvements in the resonance characteristic by controlling the shape of the piezoelectric film defined by etching.

The communication device illustrated in FIG. 8 is an exemplary communication device, and similar effects may be obtained in another communication device equipped with the piezoelectric thin-film resonators of the present embodiment.

The embodiment that has the additional patterns 10 and 12 has an improved mechanical strength of the lower electrode 2 and improves the humidity resistance in the end portion 2a of the lower electrode 2. The additional pattern 10 disposed on the hold portion 2b side of the lower electrode 2 partially increases the thickness of the lower electrode 2, and improves the mechanical strength of the lower electrode 2.

The additional pattern 10 disposed on the end portion 2a side of the lower electrode 2 prevents the etchant from etching the piezoelectric film 3 when the sacrificed layer 9 that does not contact the piezoelectric film 3 is removed by the etchant. It is further possible to prevent the piezoelectric film 3 from being exposed to the air and moisture outside of the device and to prevent the quality of the piezoelectric film 3 from being degraded.

The additional pattern 12 provided on the additional pattern 10 further increases the film thickness in the vicinity of the hold portion 2b of the lower electrode 2, whereby the mechanical strength of the lower electrode 2 is further improved.

The piezoelectric film 3 may be etched so as to control the shape of the end surface 3a of the piezoelectric film 3 defined by etching in such a manner that the angle β between the end surface 3a and the lower electrode 2 is approximately 90°. Thus, the resonance characteristic may be improved.

The dome-shaped cavity 6 is formed between the lower electrode 2 and the substrate 1. Thus, the piezoelectric thin-film resonator is formed on the flat main surface of the substrate 1 that has not been shaped into a recess. It is thus possible to improve the productivity and achieve cost reduction. Since the cavity is not formed in the substrate 1, the mechanical strength thereof may be improved.

The stress of the multilayered film including the lower electrode 2, the piezoelectric film 3 and the upper electrode 4 is made compressive. It is thus possible to form the cavity 6 between the multilayered film and the surface of the substrate 1 with high reproducibility.

Since the shape of the resonance portion R1 is elliptical, it is possible to suppress the acoustic waves reflected by ends of the lower electrode 2 and the upper electrode 4 and the outer circumference of the piezoelectric film 3 from existing as standing waves in the lateral direction within the resonance portion R1 (the direction of the surface of the substrate 1). It is thus possible to suppress the occurrence of a ripple in the pass band.

Since the resonance portion R1 has a polygonal shape composed of non-parallel sides, it is possible to suppress the acoustic waves reflected by ends of the lower electrode 2 and the upper electrode 4 and the outer circumference of the piezoelectric film 3 from existing as standing waves in the lateral direction within the resonance portion R1. It is thus possible to suppress the occurrence of a ripple in the pass band.

The present invention includes the piezoelectric thin-film resonators, filters, duplexers, communication modules and communication devices.

The present invention is not limited to the specifically disclosed embodiments, but other embodiments and variations may be made without departing from the scope of the present invention.

What is claimed is:

1. A piezoelectric thin-film resonator comprising:
   a substrate;
   a lower electrode provided on the substrate;
   a piezoelectric film provided on the substrate and the lower electrode;
   an upper electrode provided on the piezoelectric film; and
   an additional pattern,
   a cavity being formed between the lower electrode and the substrate in a resonance portion in which the lower electrode and the upper electrode face each other through the piezoelectric film,
   the additional pattern being provided in a position that is on the lower electrode and includes an interface between the resonance portion and a non-resonance portion.

2. The piezoelectric thin-film resonator as claimed in claim 1, wherein the cavity has a dome shape.

3. The piezoelectric thin-film resonator as claimed in claim 1, wherein an end portion of the cavity and an end portion of the lower electrode have an identical planar shape.

4. The piezoelectric thin-film resonator according to claim 1, wherein the additional pattern is made of a dielectric material.

5. The piezoelectric thin-film resonator according to claim 1, wherein the additional pattern is a multilayered film.

6. The piezoelectric thin-film resonator according to claim 1, wherein the additional pattern is a multilayered film, which includes a lowermost layer made of a dielectric material, and an uppermost layer made of a material that is resolved by an etchant for removing the piezoelectric film.

7. The piezoelectric thin-film resonator according to claim 1, wherein a multilayered film composed of the lower electrode, the piezoelectric film and the upper electrode has compressive stress.

8. The piezoelectric thin-film resonator according to claim 1, wherein a planar shape of the resonance portion includes an elliptical shape.

9. The piezoelectric thin-film resonator according to claim 1, wherein the resonance portion has a polygonal shape surrounded by lines that are not parallel to each other.

10. The piezoelectric thin-film resonator according to claim 1, wherein the resonator has an opening connecting to the cavity from an outside of the cavity.

11. The piezoelectric thin-film resonator according to claim 1, wherein the piezoelectric film is made of a material including aluminum nitride or zinc oxide as a main component.

12. A communication module comprising a piezoelectric thin-film resonator including:
   a substrate;
   a lower electrode provided on the substrate;
   a piezoelectric film provided on the substrate and the lower electrode;
   an upper electrode provided on the piezoelectric film; and
   an additional pattern,
   a cavity being formed between the lower electrode and the substrate in a resonance portion in which the lower electrode and the upper electrode face each other through the piezoelectric film,
   the additional pattern being provided in a position that is on the lower electrode and includes an interface between the resonance portion and a non-resonance portion.

13. A communication device comprising a piezoelectric thin-film resonator including:
   a substrate;
   a lower electrode provided on the substrate;
   a piezoelectric film provided on the substrate and the lower electrode;
   an upper electrode provided on the piezoelectric film; and
   an additional pattern,
   a cavity being formed between the lower electrode and the substrate in a resonance portion in which the lower electrode and the upper electrode face each other through the piezoelectric film,
   the additional pattern being provided in a position that is on the lower electrode and includes an interface between the resonance portion and a non-resonance portion.

* * * * *